United States Patent [19]
Hesselbom

[11] Patent Number: 6,014,313
[45] Date of Patent: Jan. 11, 2000

[54] PACKAGING STRUCTURE FOR INTEGRATED CIRCUITS

[75] Inventor: Hjalmar Hesselbom, Huddinge, Sweden

[73] Assignee: Telefonaktiebolgey LM Ericsson, Stockholm, Switzerland

[21] Appl. No.: 08/994,648

[22] Filed: Dec. 19, 1997

[30] Foreign Application Priority Data

Dec. 19, 1996 [SE] Sweden .................................. 9604690

[51] Int. Cl.⁷ ...................................................... H05K 7/20
[52] U.S. Cl. ........................ 361/704; 361/707; 361/712; 361/713; 361/715; 361/716; 361/721; 361/790; 257/686; 174/16.3
[58] Field of Search .................................... 361/688, 689, 361/699, 704, 715, 716, 719, 790; 257/685, 686; 174/16.3, 252, 255

[56] References Cited

U.S. PATENT DOCUMENTS

| | | | |
|---|---|---|---|
| 5,016,138 | 5/1991 | Woodman | 361/688 |
| 5,040,052 | 8/1991 | McDavid | 361/793 |
| 5,051,865 | 9/1991 | Kato . | |
| 5,241,450 | 8/1993 | Bernhardt et al. . | |
| 5,295,044 | 3/1994 | Araki et al. . | |
| 5,322,816 | 6/1994 | Pinter . | |
| 5,329,423 | 7/1994 | Scholz . | |
| 5,371,654 | 12/1994 | Beaman et al. | 361/744 |
| 5,426,563 | 6/1995 | Moresco et al. . | |
| 5,544,017 | 8/1996 | Beilin et al. | 361/790 |

FOREIGN PATENT DOCUMENTS 0439 134   7/1991   European Pat. Off. .

*Primary Examiner*—Leo P. Picard
*Assistant Examiner*—Boris C. Chervinsky
*Attorney, Agent, or Firm*—Burns, Doane, Swecker & Mathis, L.L.P.

[57] ABSTRACT

A three-dimensional multi-chip module is formed as a stack of two-dimensional multi-chip modules comprising substrates which have electrically signal paths connecting integrated circuit chips and has vertical interconnections of the signal paths, provided by interconnection or via chips. The individual chips or other inner components on a substrate are in mechanical contact with a surface of an adjacent substrate and constitute the distance device maintaining the substrates spaced from each other. Thus heat developed in components can be conducted essentially perpendicularly to the substrates. Thermally conducting chips can be used for improving the conducting of heat. Cooling devices are located only at the top and bottom surfaces of the stack. Channels are formed between the chips and components which can be used for cooling and furthermore spaces are formed at the edges of the substrates in which electrical connectors can be inserted for coupling the stack to a similar stack, since there are no cooling devices at the lateral surfaces of the stack. The components of the stack is maintained in a detachable manner in electrical and mechanical contact with each other by applying a compressive force and by using elastic connecting and guiding devices. In particular bumps can be arranged cooperating with edge surfaces of components to guide components to correct positions.

29 Claims, 4 Drawing Sheets

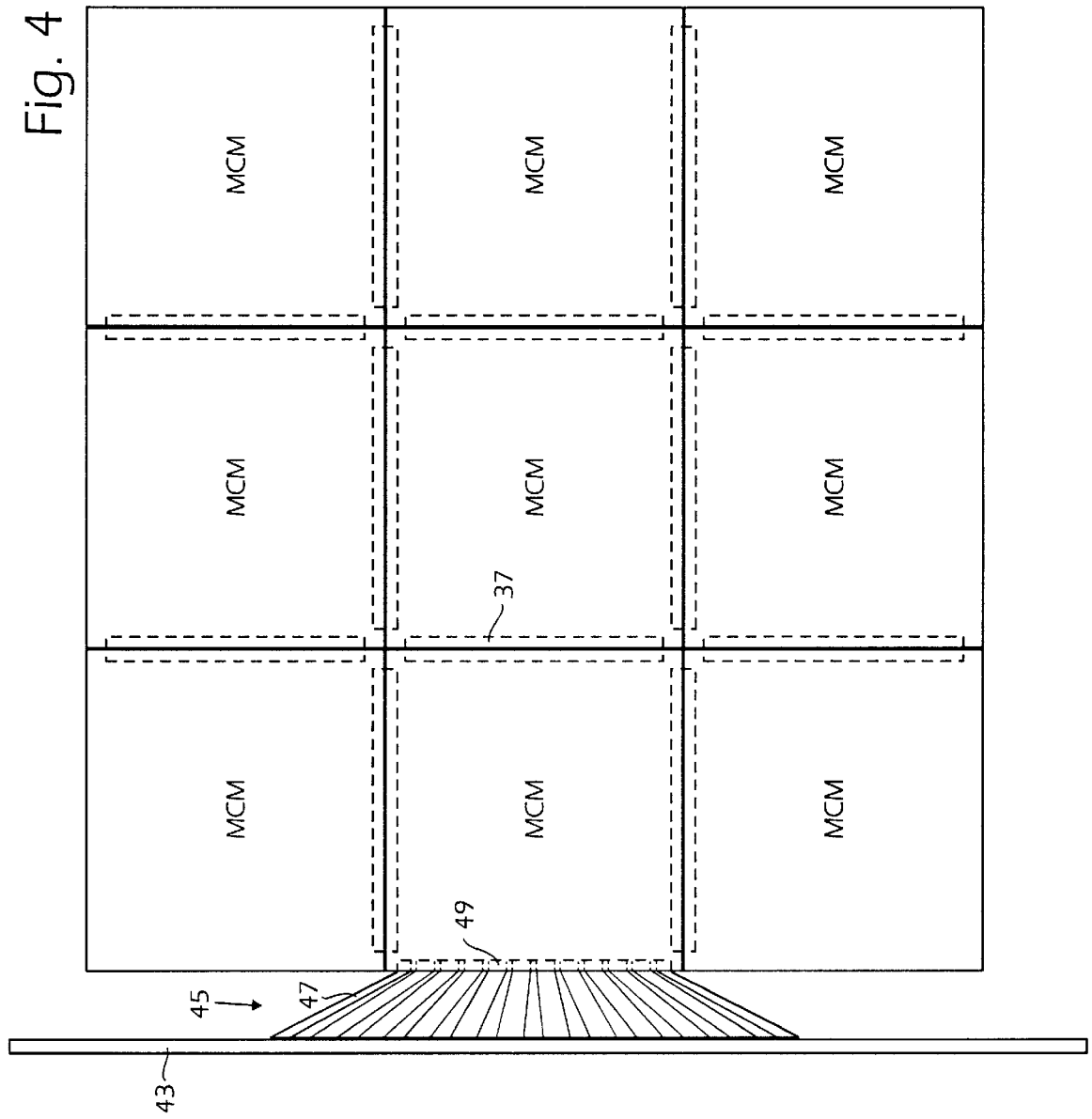

PACKAGING STRUCTURE FOR INTEGRATED CIRCUITS

The present invention relates to three-dimensional or multi-level multi-chip modules, MCMs.

BACKGROUND AND STATE OF THE ART

The technical evolution in the field of integrated circuits has resulted in a demand for faster and more compact systems. In many applications a compact structure combined with a low weight is in itself a requirement. The technical evolution also tends towards more complex electronic systems involving a greater and greater number of components which need to communicate with each other. In order for the new systems to meet also the requirement of quick access between different components, the length of the signal paths between different components of the system must be kept within some rather small limits.

When the complexity of an electronic system grows, the lengths of the signal paths between components, which need to communicate with each other, also grow. In order not to exceed the maximum electric distance or maximum signal path length allowed between such components, which need to have a quick communication with each other, the components have been made smaller and smaller and they have also been packed more and more densely. Thus, electronic multi-chip modules have been developed, which permit a very dense packaging of unencapsulated integrated circuits, ICs, or chips. In fact, the signal distances between different active and passive components in such modules do not become much larger than in the case where the whole system had been integrated monolithically on a single chip.

However, the maximum distance, which is determined by the performance requirements set for a considered system, between components which need to communicate with each other, becomes unnecessary restricted in a complex system if only one plane of interconnected chips and/or components can be used, since only components in this single plane then can be reached within the maximum distance.

In order to overcome this problem, three-dimensional or multi-level multi-chip constructions can be used. This means that the communication lines extending from a considered component can not only reach components in the same plane of a multi-level multi-chip module but also components in planes located above and underneath the component can be directly accessed through short signal paths.

This can be obtained in some different manners. Conventional systems having modules such as circuit boards connected to a back plane are in a sense three-dimensional. However, they do not fulfill the above discussed requirement of short signal paths between all those components, which need to communicate with each other. This can not be achieved when components which are close in space are connected by long lines, which obviously becomes the case when two components are connected according to these conventional systems. Also stacks of two-dimensional multi-chip modules having interconnections at the side of the stacks result in long signal paths. If a signal connection between two centrally located components on two different neighbouring multi-chip module planes in such as stack is to be obtained, they are thus connected through a lateral path, a short vertical path at the side of the stack and then a final lateral path on the other plane, adding up to a relatively long distance compared to the case where they are connected for instance directly through a hole in one of the substrates.

Systems are also used comprising a multitude of chips glued together to form a tower or stack and having vertical connections at the side of the chip stack. If more than one stack of chips are used, which have a central or a bottom electrical connection, there can also be problems in arranging short signal paths between the chips. Consider for example the case of two chips located next to each other, but on the top of each pile, which are to communicate with each other. There may also be cooling problems associated with such chip piles.

In order to solve this problem for the case where several two-dimensional multi-chip modules are piled on top of each other forming a three-dimensional multi-chip module, vertical interconnections between the planes located on top of each other have to be formed.

If the vertical interconnections are located closely enough, chips of one plane can not only have a direct contact by means of a short electrical or optical line with its neighbours on the same plane but also with its neighbours above and below. This is a major advantage in the case where components on different planes need to communicate, since the length of the signal paths between such components can be significantly reduced and hence more complex systems can be built, which still meet the requirement of short signal paths between components communicating with each other.

Thus, U.S. Pat. No. 5,371,654 discloses a three-dimensional multi-chip module structure having interconnection means provided in the structure for obtaining vertical interconnections between adjacent assemblies formed by substrates having electrical devices disposed thereon. The interconnection means are made of an elastomeric material having a plurality of electrical conductors extending therethrough, and the interconnection means are made to electrically connect two different adjacent assemblies by compressing the stack of assemblies, the compressive force, in the finished structure, being derived from the fact that the edges of the substrates are inserted in grooves in heat dissipation blocks located at the sides of the structure. The heat dissipation is obtained by manufacturing the substrates of the assemblies of a material having a high thermal conductivity so that the heat will be conducted to the edges of the substrates, where it is carried away by the heat dissipating cooling blocks.

U.S. Pat. No. 5,016,138 discloses a three-dimensional integrated circuit package in which integrated circuit chips are attached to electrically isolating substrates having conducting traces, the electrical connection to the traces being made by wire bonding or flip-chip bonds. A frame surrounds the chips located on a surface of a substrate. Heat sink members made of metal or another heat conductive material, which typically also conducts electrical signals, are inserted between the substrates and the free surfaces of the chips and are located to be in contact with those surfaces of the substrates to which no integrated circuit chips are attached. In the case where the chips are flip-chip bonded to the substrates, a thermally conducting bond, commonly eutectic, can be formed in the space between the back surface of the chips and the heat sinks. Otherwise, metal slugs can be embedded in the substrate in appropriate locations underneath the respective chips for conducting heat from the chips to the heat sinks.

U.S. Pat. No. 5,051,865 discloses a multi-layer semiconductor device including a stacked wafer body. A stack is formed of base unit structures, each comprising an aluminum plate having a silicon wafer on each one of its two large surfaces. The base unit structures are attached to each other by silicone resin, the resulting stack being essentially solid and compact, having no voids and not allowing an easy dismounting of the device.

In U.S. Pat. No. 5,426,563 a three-dimensional module for housing a plurality of integrated circuit chips is described. The structure has communication bars, which also serve as spacers between adjacent substrates of the module. This arrangement provides cooling channels, in which a cooling fluid is present.

In U.S. Pat. No. 5,329,423 an electrically and mechanically connected assembly is disclosed which can be a chip package and can be used in forming multi-chip modules. A bump-and-socket arrangement provides a degree of self-alignment and allows the members to be demountably attached to each other. A similar arrangement of cooperating bumps and recesses is disclosed in the published European patent application 0 439 134 A2 used for packaging a semiconductor device.

Finally, U.S. Pat. No. 5,241,450 also discloses a plurality of multi-chip modules stacked on top of each other.

However, the structures described above suffer from a number of major drawbacks. In particular these drawbacks are related to their thermal dissipation means and to the manner in which the structures are mounted.

Thus, the arrangement comprising cooling means arranged at the lateral sides of the three-dimensional multi-chip module, where the end surfaces of the substrates are located, makes it difficult or impossible to easily and directly connect the module to another three-dimensional multi-chip modules of the same kind at a side provided with cooling means arranged in that way. Therefore, if several three-dimensional multi-chip modules are to be interconnected to form a larger system, the system cannot be built very compact, which today, as stated above, often is a requirement in itself.

Furthermore, the structures and/or the individual chips are in many cases basically fixedly or rigidly mounted to each other. This becomes a problem when an integrated circuit or an entire plane of a three-dimensional multi-chip module is to be replaced, since the procedure of replacement can damage other components of the three-dimensional multi-chip module.

SUMMARY

It is an object of the present invention to provide a three-dimensional multi-chip module comprising of a plurality of assemblies, each assembly housing a plurality of integrated circuit chips, in which an individual chip or assembly or an entire plane of a three-dimensional multi-chip module can easily be replaced.

It is a further object of the invention to provide a cooling arrangement for such a structure, which can also include means for cooling integrated circuits which are located inside such as somewhere in the middle of the structure and which generate large amounts of heat.

It is yet another object of the invention to provide a three-dimensional multi-chip module, which can easily be connected to other similar three-dimensional multi-chip modules or generally to other devices.

These and other objects are obtained by a three-dimensional multi-chip module formed as a stack of at least two two-dimensional multi-chip modules having a multitude of vertical interconnections. In the three-dimensional multi-chip module obtained, owing to the resulting short signal paths, an individual chip or component can have a direct electrical contact both with laterally adjacent chips as well as with vertically adjacent ones.

In order to establish the vertical electrical interconnections special interconnection chips, via chips, are provided. Hence, the active chips on the two-dimensional multi-chip module cannot be as densely packed as on a regular two-dimensional multi-chip module. The vertical density of chips also becomes reduced compared to piled chips, since an electrically isolating substrate carrying electrically conducting signal paths must be provided between every layer of chips. Despite this, the number of chips reachable within a certain length of connection, which as stated above often is a limiting or restricting requirement, can be much larger than for two-dimensional structures and for such three-dimensional structures having only external vertical connections such as at a side of the structures.

However, the compact structure of active chips can result in a thermal dissipation problem. This problem is solved by locating chips that generate large heat amounts near the top or bottom of the three-dimensional multi-chip module and in the case where this is impossible by providing special heat conducting bodies in layers or levels at one side or two sides of such a "hot" chip.

Further, if the substrate on which the two-dimensional multi-chip modules are built are made of a material having a good heat conductivity, the heat conducting bodies do not need to be placed directly adjacent to such "hot" chips.

Furthermore, the system is built of a plurality of flat two-dimensional multi-chip modules, where the surfaces of each chip on a substrate facing away therefrom are made to form a plane either by grinding before or after the mounting of the chips or by using a system having inserted precision blocks. Thereby, the backsides of each component can be in a direct mechanical contact with the above, adjacent substrate. In addition, this provides a movable contact having good heat conduction characteristics. In order to improve the movability and the heat conduction a grease, oil or a liquid metal can be applied to the backside of the individual chips.

The via structures connecting neighbouring substrates are also constituted by chips, as has already been mentioned. However, these chips are not active and only serves as electrical interconnection means between two adjacent levels of the three-dimensional multi-chip module.

The top and bottom surfaces of the three-dimensional multi-chip module are provided with cooling means. The cooling means can be in direct mechanical contact with the top surfaces of the integrated circuits chips and other chips of e.g. the substrate located topmost in the stack and with the bottom surface of the bottom substrate in the case where components are mounted on the upper surface of the substrates. If such a direct contact with integrated circuits is not desired, an extra substrate having no chips mounted thereon can be located on top of the stack.

Arranging cooling means only at the top and bottom surfaces of the three-dimensional multi-chip module or pile makes it possible to use devices for connecting conducting paths at substrate edges such as described in the Swedish patent application No. 9604689-1, "A substrate edge connector". Thereby it becomes possible to easily laterally connect one three-dimensional multi-chip module to another one.

Furthermore, the three-dimensional multi-chip module is only kept together by compressing means applied to the top surface and bottom surface of the module. This makes it very easy to disassemble the module for repair or for replacement of individual chips of a three-dimensional multi-chip module, without risking damage to other chips of the system.

Thus generally, a three-dimensional multi-chip module comprises at least two two-dimensional multi-chip modules stacked on top of each other. Each two-dimensional multi-chip module comprises a substrate which typically is a flat, electrically isolating plate carrying at its surface or surfaces and/or inside electrically conducting paths intended for carrying electrical signals and at least one integrated circuit chip mounted with a first surface on and electrically connected to the conducting paths of the substrate. For constituting a "genuine" three-dimensional multi-chip module it is required that at least two integrated circuit chips on different substrates are electrically connected to each other. The integrated circuit chips of the three-dimensional module can be flip-chip mounted or at least flip-chip-type mounted. The integrated circuit chips of a layer of the module are mounted so that backsides or second surfaces, i.e. those surfaces where no electrical terminals or no electrically conducting areas are located, usually the top surfaces, of the integrated circuit chips are in a direct mechanical contact with a surface area of an adjacent substrate. The chips thereby at the same time form the means separating adjacent substrates, serving as distance maintaining or spacing means between the substrates. No frames or similar elements are thus used or required. Thus, the mounting of the integrated circuit chips is such that a surface of an integrated circuit chip, with which surface the chip is not mounted to or is not electrically connected to an associated substrate, is in only a direct mechanical contact with the surface of an adjacent surface. This mechanical contact can generally be a sliding contact enhanced by some liquid like oil, which also connects the chip thermally to the substrate.

For cooling the three-dimensional multi-chip module external cooler or heat conducting blocks can be arranged to be in thermal contact with outermost large surfaces of substrates and/or of integrated circuit chips. The inner heat conduction in the three-dimensional multi-chip module is enhanced by arranging internal heat conducting blocks which are located between two adjacent substrates and are in thermal contact with large, facing surfaces of these substrates. Such a heat conducting block can also be arranged on a topmost substrate to be in contact with it at one of its surfaces and then contact a cooler block with its opposite surface.

Compression means can be provided acting with a compressing force on outermost large surfaces of the pile of two-dimensional multi-chip modules and thus on large surfaces of the outermost substrates and/or of outermost integrated circuit chips. Further, this compressing force can be the only force maintaining all the components, i. e. all the various chips and all the substrates, in the desired position in relation to each other, so that no fixed or rigid individual mechanical securing exists or is required. The positioning laterally of the components is accomplished by suitable lateral positioning means.

Further, for connecting the three-dimensional multi-chip module to other devices such as other similar three-dimensional multi-chip modules at least one substrate has a free marginal portion at one edge line thereof to form a free space or free channel at this marginal portion. In this marginal portion exposed, electrically conducting areas are provided to electrically connect the substrate to another device, e.g. a substrate in a multi-chip module or to a special connector means. The free space at a side of the module is then located between two adjacent substrates at the edges thereof or between a substrate and an end block, where at least one substrate has a free marginal surface portion.

A connector unit adapted for connecting said substrate then has a shape adapted so that the unit can be inserted at least partially in the free space. It further carries an electrically conductive pattern or generally exposed, electrically conductive areas on a surface thereof, the conductive pattern or areas being adapted to come in electrical contact with similar exposed, electrically conducting areas on the marginal portion when the connector unit is inserted in the free space. The connector unit may have the shape of an elongated rectangular body or strip having a central axis in its longitudinal direction. The portion of the connector unit which is located at one side of the central axis it then adapted to electrically contact a substrate in the considered three-dimensional multi-chip module and the portion located at the other side of the central axis is adapted to electrically contact a substrate in another, similar three-dimensional multi-chip module. A connector unit can also be designed so that the portion of the connector unit located at one side of the axis is adapted to electrically contact a substrate in the three-dimensional multi-chip module and the portion located at the other side of the central axis is adapted to electrically contact electrically conducting areas in further connector means such as a backplane.

Positioning means can be provided on a connector unit and on a marginal portion of the substrate at the free space for achieving an accurate positioning of the connector unit on the substrate, also making the connector unit detachable. The positioning means can then comprise projections such as bumps located on a surface at the marginal portion of the substrate and cooperating with edge surfaces or corners of the connector unit.

At least one via chip can be provided which is located between and in electrical contact with two adjacent substrates. Such a via chip comprises electrically conducting paths extending from a surface of the via chip to an opposite surface thereof, these conducting paths electrically interconnecting electrically conducting layers at and/or in facing surfaces or layers of these substrates.

The positioning means mentioned above can comprise positioning means for the pair of a chip and a substrate, which are pressed against each other, for achieving an accurate positioning of the chip on the substrate. The positioning means can comprise a groove located on a surface of one of the chip and the substrate for cooperating with a projection, a bump, a row of bumps or a ridge provided on a surface of the other one of the chip and the substrate. Further, for simplifying the electrical connecting of the chip to the substrate, the positioning means can comprise electrically conducting surface areas, which electrically contact and connect to each other when the chip and the substrate are pressed against each other. Other, simpler positioning means can comprise projections or bumps located on a surface of the substrate for cooperating with edge surfaces or corners of the chip which is pressed against the substrate. Such bumps can preferably be used both for components requiring a very exact positioning in order to come in contact with electrically conducting pads on the surface of a substrate and for components such as heat conducting blocks requiring only an approximate positioning on the substrate.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

A complete understanding of the invention and of the above and other features thereof may be gained from a consideration of the following detailed description of non-limiting embodiments presented hereinbelow with reference to the accompanying drawings, in which:

FIG. 4 is a view from above showing nine three-dimensional multi-chip modules connected to each other, one of the modules being also connected to a back plane.

DETAILED DESCRIPTION

Figure 1:
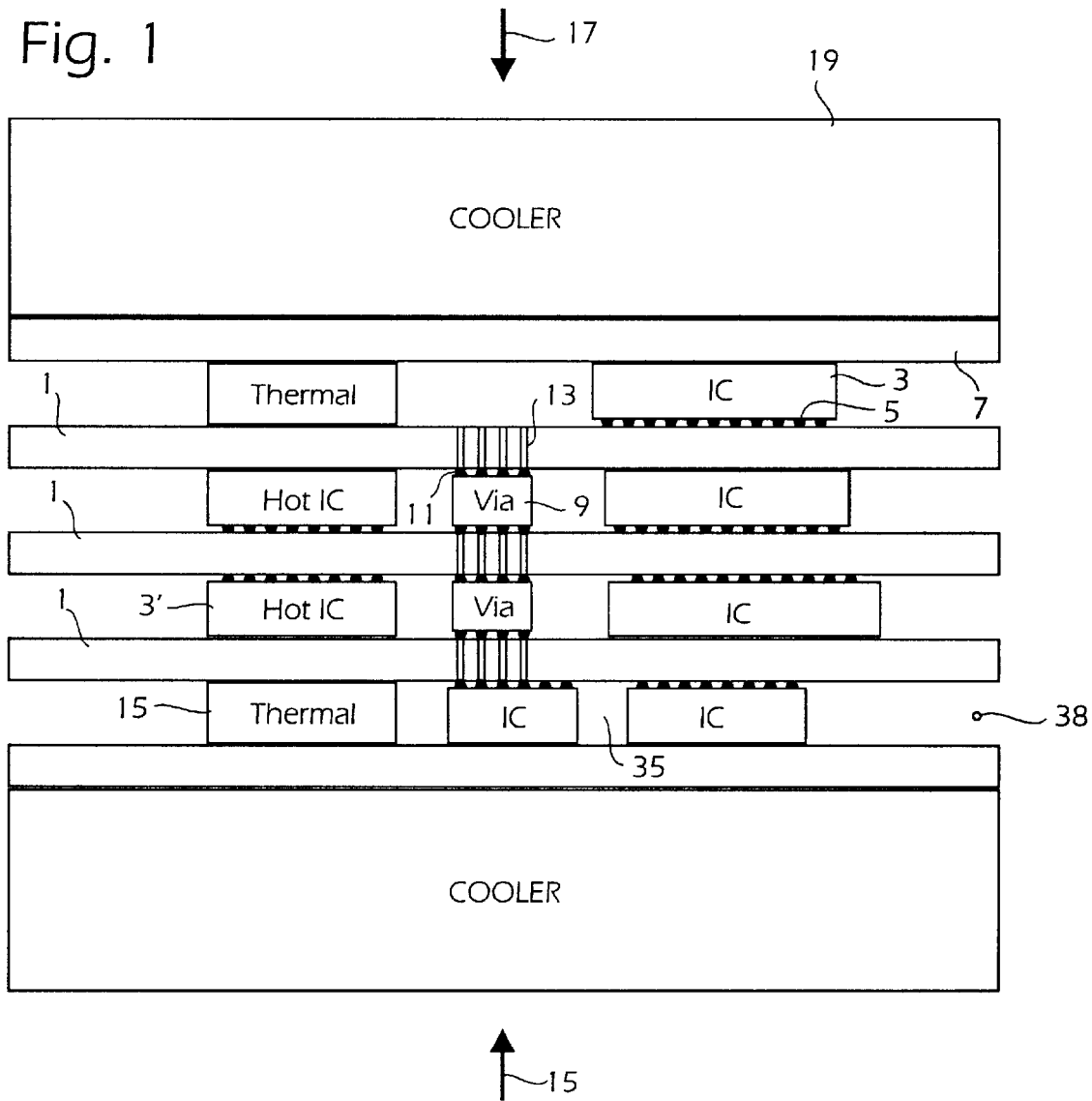
FIG. 1 is a cross-sectional view of a three-dimensional multi-chip module.

In FIG. 1 a cross-section of a three-dimensional multi-chip module, MCM, is shown. The three-dimensional module is formed by a number of two-dimensional multi-chip modules and it comprises in the embodiment shown three internal, substantially flat substrates 1, each one having one or more integrated circuit chips 3 in a mechanical direct contact with the upper and/or bottom surfaces of it. These integrated circuit chips 3 are in electrical contact with electrically conducting paths for signals or other use in and/or at least one of the substrates, at which they are located, the electrical contact elements being illustrated by a row of contacts 5. The substrates 3 are thin, flat plates and can be made by some method allowing electrical conductors at least at one surface thereof and preferably at both surfaces, in one or more layers, such as by thin film methods or preferably, as will be supposed hereinafter, by using Si-substrates processed in the same way as used for fabricating integrated electronic circuits. The substrates thus can have several layers comprising electrically conducting planes, planes for signal conductors, ground planes, insulating planes, etc. Each of the Si-substrates 1 is for instance in the conventional way supposed to be provided with at least one electrically conducting ground plane, not shown, that is to be connected to electrical ground when the three-dimensional multi-chip module is used, whereby a good electrical shielding is obtained between different planes of the module as well as for the entire three-dimensional multi-chip module. In the embodiment shown, there are also top and bottom Si-substrates 7 which are in only mechanical contact with top or bottom surfaces of chips 3, since they carry no electrical conductors.

At the inner substrates 1, but not at the substrates 7 located at the top or the bottom of the stack of two-dimensional multi-chip modules, there are also mounted passive chips, via chips 9, comprising no electric or electronic components but only signal paths constituting electrical interconnections between adjacent levels of the three-dimensional multi-chip module, i.e. between signal paths in and/or at the facing surfaces of two substrates 1, that are located adjacent each other. The via chips 9 have rows of electrical contact elements 11 at their two opposite surfaces which face the internal substrates 1, the electrical contact elements 11 being interconnected by suitable electrical paths located at and inside the via chips 9.

In the structure shown in FIG. 1 the via chips 9 can be mounted at nearly any location in a plane of the three-dimensional multi-chip module, and must not necessarily, as in the illustrated way, be placed along the same vertical line, on top of each other. This is a major advantage, since the via chips 9 can then be placed at those positions where they are best required, thereby saving space in the three-dimensional multi-chip module. The via chips 9 are in FIG. 1 illustrated to be also located in the same vertical line as sets of conventional via holes 13 in every internal substrate 1, these via through-holes 13 having plated walls for electrically connecting the two surfaces of each substrate 1 with each other or more correctly, various electrically conducting layers and paths on each surface of the substrates with each other and possibly also to the electric contact elements of the via chips 9.

Figure 2:
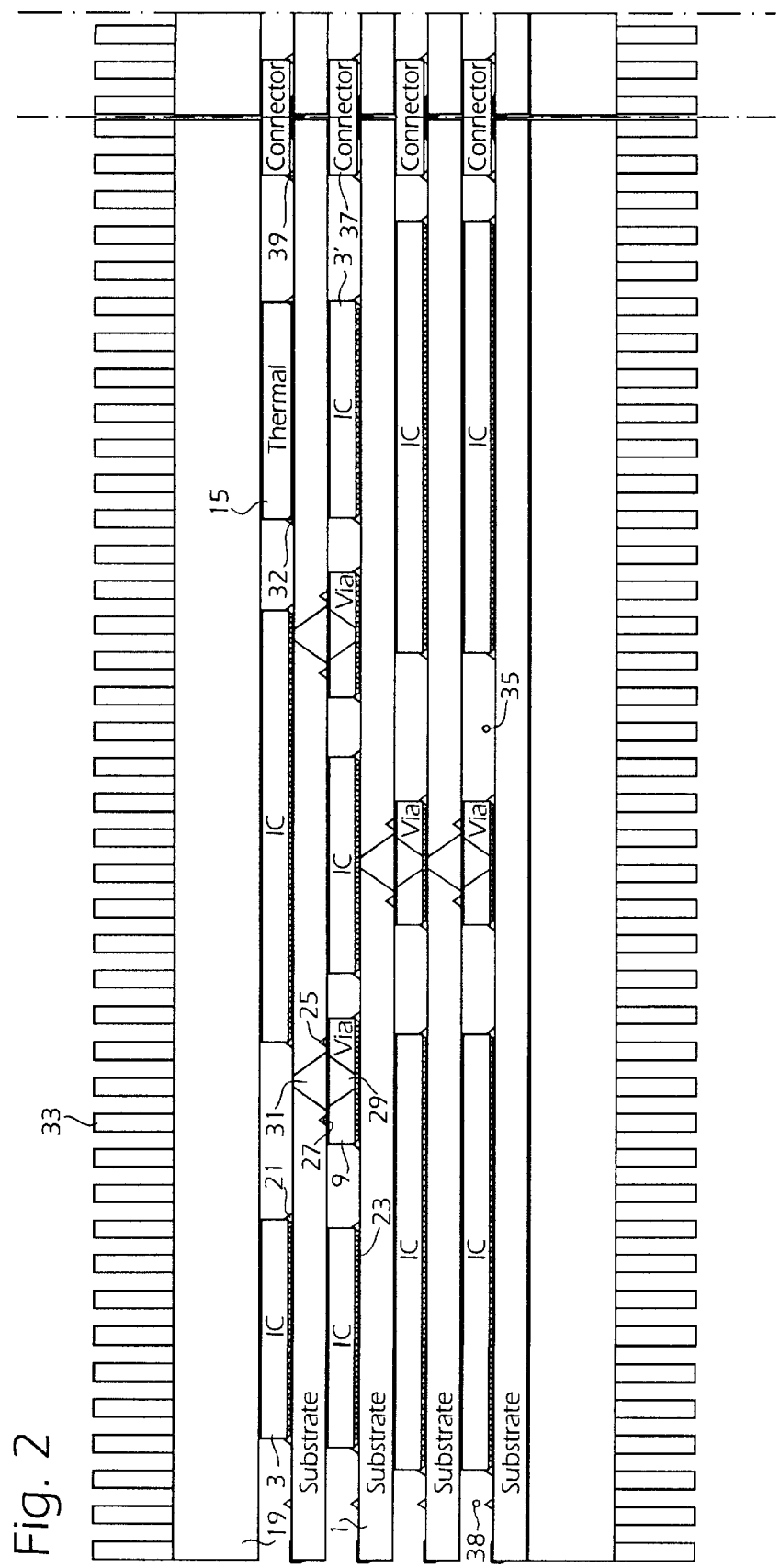
FIG. 2 is a cross-sectional view of a three-dimensional multi-chip module also illustrating aligning means for the chips and the connection of a module to a similar module.

In order to obtain impedance matched vias, allowing a space-saving connection to a plurality of parallel, densely spaced transmission lines, both in the inner substrates 1 and in the special via chips 9 via structures having etched deep V-grooves according to the Swedish patent application No. 9604688-3, "A via structure", can be used, see also FIG. 2. On at least one of the surfaces, e.g. the bottom surface, of the via chips 9 and the substrates 1 elastic bump structures which are inserted in or applied in V-shaped contact and guide grooves located at opposite, facing surfaces of the substrates 1 and via chips 9 respectively, can be provided both for obtaining an electrical connection that can easily be disassembled and for obtaining a mechanical positioning. Also, elastic bumps cooperating with edges of the chips are used. The elastic bump structure and the contact grooves can be made as described in the Swedish patent application No. 9604677-6, "High density electrical connectors".

The integrated circuit chips 3 and also possibly the via chips 9 can in a preferred embodiment be flip-chip mounted to the desired surface of respective substrates, or in another preferred embodiment they are mounted in a self-aligned manner as described in the Swedish Patent application No. 9604676-8, "Flip-chip type connection with elastic contacts". In those cases where elastic bumps are used for mechanical positioning and alignment in cooperation with V-grooves, they can in a preferred embodiment be made according to the Swedish Patent application No. 9604678-4, "Bumps in grooves for elastic positioning". These various possible arrangements makes it possible to provide a good electrical contact between surfaces of the flip-chip-type mounted chips 3 and surfaces of the adjacent substrates 1.

In the three-dimensional multi-chip module also thermal blocks 15 can be arranged at suitable places for conducting heat from such integrated circuit chips 3', which when used generate particularly much heat. These thermal blocks 15 can have the same general shape and dimensions as an integrated circuit 3, 3' and are made from a material such as Si or another material having a good thermal conductivity. They may be mechanically positioned and kept in place in the same way as the integrated circuit chips 3, 3', e.g. by the method disclosed in the cited Swedish patent application "Flip-chip-type connection with elastic contacts". Preferably they are positioned by means of bumps cooperating with the edges or narrow side surfaces of the chips.

Each level of integrated circuits and each individual chip of the three-dimensional structure may in a preferred embodiment, using appropriate ones of the described connection means, be kept together only by a compressing force applied to the top and bottom of the structure, as indicated by the arrows 17.

In order to accomplish such a piled or stacked dismountable structure, e.g. as has already been described, elastic bumps having electrically conducting surface coatings are then provided which connect a via chip 9 to an adjacent plane or surface of a substrate 1, and electrical contact is obtained by pressing the whole module together. The compressing force is provided by means of some clamping means, not shown, applying a force to the upper- and undermost, exterior parts or surfaces of the module, in particular to cooling means 19 having the shape of blocks of a suitable design, which are applied to the top and bottom surface of the structure, i.e. to the external surfaces of the top and bottom substrates 7.

Such a loose arrangement in combination with slidable electrical contacts provided by the elastic means for alignment and electrical connection reduces the thermal stresses between the components of the module to a minimum. In order for this clamping arrangement to work properly and for an assembly of the module without using any high precision equipment, some kind of mechanic registration between the planes is required. Such a registration is then advantageously performed, as has already been mentioned, by means of the via structures and/or the bump structures for via chips 9 and possibly also the bump structures for thermal chips 15 according to the cited Swedish Patent application "Bumps in grooves for elastic positioning".

By mounting the components of the three-dimensional multi-chip module in such a manner, i.e. in a stack in which each layer and each component only is kept in place by a force derived from the clamps and the alignment means and thus easily can be separated from each other without any need for desoldering or the like, each component can easily be removed and replaced, e.g. in case of a malfunctioning component.

FIG. 2 shows a three-dimensional multi-chip module similar to that of FIG. 1 but having four substrates 1 carrying integrated circuit chips 3 on basically only their top surfaces. Positioning bumps 21 on the top surfaces of the substrates 1 are visible in this figure, these bumps 21 cooperating with lower edges or corners of the integrated circuit chips 3, 3' and via chips 9. Electrically connecting bumps for connecting the surface layers of the substrates 1 to electrically conducting areas at the bottom surfaces of the chips 3, 9 are shown at 23. Furthermore FIG. 2 shows the alignment of a via chip 9 with a substrate 1 located on top of the via chip 9, an alignment of the substrates then also being achieved. The alignment is for example obtained as has been already described in the way disclosed in the cited Swedish patent application "Bumps in grooves for elastic positioning". If such an alignment is used, V-grooves 25 are etched in the respective substrate, i.e. in its top and/or in its bottom surface, for receiving elastic bumps 27 located at the top surface of the via chips 9. The cooperating bumps 27 and the V-grooves 25 can be designed to also electrically connect the via chips 9 and the next-above located substrate 1 to each other by means of the device disclosed in the above cited Swedish Patent application "High density electrical connectors".

The via chips 9 of FIG. 2 have deep V-grooves 29 provided with electrical conductors on their oblique surfaces as is described in the cited Swedish patent application "A via structure". Such via structures comprising deep V-grooves 31 are also arranged in the substrates 1. The deep V-grooves 29, 31 of a via chip 9 connecting to a substrate 1 located on top thereof and of this top substrate 1 are in the illustrated embodiment placed along the same vertical line, the cooperating alignment bumps 27 and low V-grooves 25 being located symmetrically on both sides of the deep V-grooves 29, 31. The thermal chip 15 shown in FIG. 2 is positioned by means of bumps 32 projecting from the substrate, which bumps like the bumps 21 cooperate with edge surfaces or bottom corners of the chip. Such bumps can be made in a simple way, of a rather rigid elastic material and allows a very simple mounting of the considered components at the position intended therefor. They can have triangular cross-section, the cross-section for example having the shape of an isosceles triangle.

FIG. 2 also illustrates, in the right hand portion thereof, the connection of the considered three-dimensional multi-chip module to another similar three-dimensional multi-chip module.

As has already been suggested, if a suitable mounting technique, e.g. as described in the already cited Swedish patent application "Flip-chip type connection with elastic contacts", is used all individual chips are removable and replaceable, which in many applications can save costs. This is a major advantage compared to conventional three-dimensional multi-chip modules in which the components are secured to each other by other means, e.g. glued or soldered to each other, since disassembling such three-dimensional multi-chip modules often causes damage to other components in the module, and replacement of the malfunctioning component therefore does not make the module function again.

In order to make such a malfunctioning three-dimensional module function again, it is therefore often less costly to replace a whole module or at least a plane of a three-dimensional multi-chip module. The structure as described herein is, however, designed to cope with this kind of problem. The solution is, as has been outlined above, a stacked packaging structure that only uses a compressing force for keeping each individual chip of the three-dimensional multi-chip module in its proper position.

In FIG. 2 the cooling blocks 19 for the three-dimensional multi-chip module press directly towards the bottom surface of the undermost substrate and the top surfaces of the components located on the topmost substrate and they have cooling flanges or fins 33 on their exterior surfaces. The cooling means can comprise any type of cooling known in the art, such as air or a cooling liquid flowing at or past the flanges 33.

Heat generated by the circuits of the three-dimensional multi-chip module is conducted between different layers of the multi-chip module through contact of the flat backsides of each chip with the underside of the adjacent substrate. For facilitating this process, a good thermal contact is provided between the backsides of the chips and the adjacent substrates, and is obtained, as has been described above, by grinding the backsides of the chips either before or after mounting thereof and by applying some liquid material having a good heat conductivity and preferably being electrically isolating such as a grease or an oil, but also electrically conducting materials such a liquid metals can be used provided that the surfaces contacting each other consist of electrically isolating materials. Such liquid, thermally contacting materials provide a sliding contact between the chips and substrates 1 and this sliding contact has a good thermal conductivity.

An enhanced thermal dissipation at desired locations is achieved in the way indicated above by using thermal chips 15, which thus are placed near such integrated circuits chips 3' that generate especially large amounts of heat. Such integrated circuit chips, that generate much heat, are advantageously also placed near the bottom or the top of the three-dimensional multi-chip module, i.e. close to the external cooling surfaces thereof.

In the case where the substrates 1 are made of a material having a good thermal dissipation such as Si, a good lateral heat transport is obtained and hence the temperature will not vary too much within the three-dimensional multi-chip module.

In order to provide a cooling arrangement for modules generating greater power densities than can be cooled by an arrangement according to the above, the channels 35, see FIGS. 1 and 2, formed around and the small sides or edges of the chips 3, 3', 9, 15 of each plane or level can be used for a two phase cooling. This is obtained by arranging a frame, not shown, around each module which provides a sealed system for transportation of the cooling medium to an external condenser. Of course, such a cooling arrangement will make it impossible to provide side contacts for contacting exterior devices and similar three-dimensional multi-chip modules at two opposite side surfaces of the entire module, but still the other two opposite side surfaces can be used for such purposes, as will be described in detail hereinbelow.

Thus, an advantage exists which is obtained by only using the top and bottom surfaces for cooling, the advantage comprising that all the edges of each two-dimensional multi-chip module can be equipped with edge contacts similar to those of circuit boards whereby an electrical connection and also a mechanical connection between two three-dimensional multi-chip modules can be obtained. Such contacts are preferably designed according to the cited Swedish patent application "A substrate edge connector", which provides transitions to similar multi-chip modules or external devices, where the transition lines even can be made impedance matched. A connector structure designed in that way comprises a multitude of connections that can be very densely packed and it also provides a possibility to connect optical waveguides to each other, which also can be very densely packed.

Figure 3:
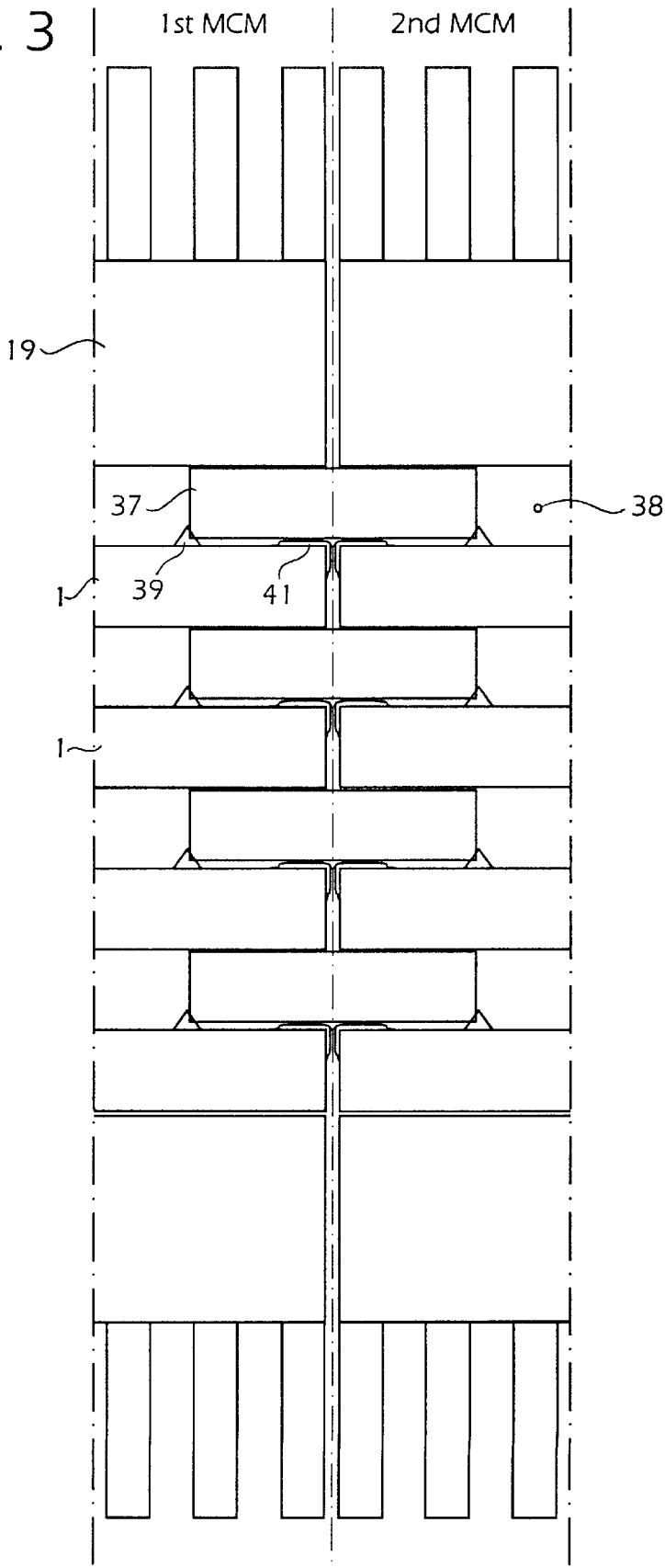
FIG. 3 is an enlarged partial, cross-sectional view showing the connection region of two three-dimensional multi-chip modules connected to each other.

In FIG. 3, which is an enlarged view of the right portion of FIG. 2, the mechanical and electrical connection of two three-dimensional multi-chip modules to each other is shown in some detail. The interconnection between the two three-dimensional multi-chip modules is here obtained by means of substrate edge contacts as described in the cited Swedish patent application "A substrate edge connector" using a substantially rectangular, elongated interconnector strip or interconnector substrate 37. Such interconnector strips 37 have essentially the same thickness as all the chips 3, 3', 9, 15 and are inserted in the free spaces 38 between two adjacent substrates 1 of a first three-dimensional multi-chip module or between the top substrate and the bottom surface of the upper cooler block 19 and between two adjacent substrates 1 or between the top substrate and a cooler block 19 of a neighbouring second three-dimensional multi-chip module, which has one of its side surfaces in mechanical contact with the first module. The interconnector strips 37 thus have a longitudinal central axis or plane and the portion on one side of this axis or plane is connected to a first three-dimensional multi-chip module and the portion thereof on the opposite side is connected to a second three-dimensional multi-chip module. This further implies, that the marginal portions of the individual substrates 1, where such an interconnector strip 37 is to be connected, are not allowed to carry any chips so that free spaces 38 are formed at the marginal regions of the substrates 1 belonging to the same three-dimensional multi-chip module, the free spaces forming channels or grooves for receiving a half of an interconnector 37.

For positioning the interconnector strips 37 elastic bumps 39 can be used in the same manner as has been described for the thermal blocks 15, these bumps being located at appropriate positions on the substrates 1 and cooperating with edges or small side surfaces or corners of the connector strips 37. The electrical connection of conducting paths on one substrate 1 in a first three-dimensional multi-chip module to conductive paths on a neighbouring substrate 1 in a second three-dimensional multi-chip module can be made by means of elastic pads 41 having electrical conductors thereon contacting conductive paths at the bottom surface of the connector strips 37 as described in detail in the cited Swedish patent application "A substrate edge connector".

In the plan view of FIG. 4 is illustrated how nine three-dimensional multi-chip modules are connected to each other. The nine multi-chip modules are here connected to each other in a 3×3 matrix, but any suitable connection configuration can of course be used for the multi-chip modules. Along all internal edges of the three-dimensional multi-chip modules interconnector strips 37 are positioned. Also, as shown in FIG. 4, one of the three-dimensional multi-chip modules can be connected to a back plane 43 through a special connector part 45 having a widening, fan-ut portion 47 and a margin portion 49 inserted between adjacent substrates 1 in the chosen three-dimensional multi-chip module in the same way as the interconnector strips 37. The margin portion 49 can be designed basically like one half of an interconnector strip 37.

Thus, a three-dimensional multi-chip module has been described. The three-dimensional multi-chip module as described herein has several advantages compared to the ones made according to the prior art. For example, the structure of the module allows a gentle disassembly of the device for replacing defective components. It provides a possibility of locating nearly arbitrarily the interconnections between different planes in the module. Furthermore, the arrangement comprising the cooling means on the top and bottom surfaces of the module allows for an easy lateral mechanical and electrical connection to other similarly constructed three-dimensional multi-chip modules.

Additional advantages and modifications will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents.

What is claimed is:

1. A three-dimensional multi-chip module comprising at least two basically planar multi-chip modules stacked on top of each other, at least two electrically isolating substrates having electrically conducting paths, one substrate included in each basically planar multi-chip module, and at least two integrated circuit chips, at least one integrated circuit chip included in each basically planar multi-chip module, each integrated circuit chip having a first surface comprising electrical terminals and a second surface opposite the first surface, each integrated circuit chip being mounted with its first surface on and electrically connected to the electrically conducting paths of the electrically isolating substrate of the respective basically planar multi-chip module, wherein the at least two integrated circuit chips included in the three-dimensional multi-chip module are electrically connected to each other, and the at least one integrated circuit chip of each basically planar multi-chip module is mounted so that its second surface is in mechanical and thermal contact with an adjacent electrically isolating substrate, this at least one integrated circuit chip serving as a distance or spacing element between adjacent electrically isolating substrates of the at least two basically planar multi-chip modules.

2. The three-dimensional multi-chip module of claim 1, wherein the at least one integrated circuit chip of each of the basically planar multi-chip modules is flip-chip mounted to the substrate of the respective basically planar multi-chip module.

3. The three-dimensional multi-chip module of claim 1, further comprising external cooler and/or heat conducting blocks being in thermal contact with outermost large surfaces of the substrates and/or of the integrated circuit chips.

4. The three-dimensional multi-chip module of claim 1, further comprising internal heat conducting blocks located on the substrates, between two adjacent substrates or between one of the substrates and a surface of an external cooler and/or heat conducting block, and in thermal contact with large, facing surfaces of these substrates or of one of the substrates and the block.

5. The three-dimensional multi-chip module of claim 1, further comprising compression means acting with a compressing force on outermost large surfaces of the substrates and/or of the integrated circuit chips.

6. The three-dimensional multi-chip module of claim 5, wherein said compressing force is the only means maintaining the components of the three-dimensional multi-chip module in their positions in relation to each other.

7. The three-dimensional multi-chip module of claim 1, further comprising at least one substrate having a free marginal portion at one edge thereof, this marginal portion having exposed, electrically conducting areas allowing electrical connection of the substrate to another substrate in a multi-chip module or to a connector means.

8. The three-dimensional multi-chip module of claim 1, further comprising a free space at a side of the three-dimensional multi-chip module, the free space being located between two adjacent substrates at edges thereof, at least one of the adjacent substrates having a marginal surface portion at the edge thereof located at the free space, the marginal surface portion having exposed, electrically conducting areas allowing electrical connection of the substrate having the marginal surface portion located at the free space to another substrate in a multi-chip module or to a connector means.

9. The three-dimensional multi-chip module of claim 7, further comprising a detachable connector unit having a shape being adapted to be inserted at least partially in a free space at the marginal portion of one of the substrates and carrying an electrically conductive pattern on a surface thereof, this conductive pattern being adapted to come in electrical contact with such exposed, electrically conducting areas on the marginal portion when the connector unit is inserted in the free space.

10. The three-dimensional multi-chip module of claim 9, wherein the connector unit has the shape of an elongated rectangular body or strip having a central axis in a longitudinal direction thereof, a portion of the connector unit located at one side of the central axis being adapted to electrically contact one of the substrates in the three-dimensional multi-chip module when the connector unit is inserted in the free space.

11. The three-dimensional multi-chip module of claim 10, wherein a portion of the connector unit located at the other, opposite side of its central axis is adapted to electrically contact a substrate in another, similar three-dimensional multi-chip module.

12. The three-dimensional multi-chip module of claim 10, wherein a portion of the connector unit located at the other, opposite side of its central axis is adapted to electrically contact electrically conducting areas in a connector means or a backplane.

13. The three-dimensional multi-chip module of claim 10, further comprising positioning means provided on the connector unit and on the marginal portion of the substrate at the free space for achieving an accurate positioning of the connector unit on the substrate.

14. The three-dimensional multi-chip module of claim 13, wherein the positioning means comprise projections located on a surface at the marginal portion of the substrate for cooperating with edge surfaces or corners of the connector unit.

15. The three-dimensional multi-chip module of claim 1, wherein
different electrically conducting layers of the three-dimensional multi-chip module are interconnected by means of via holes in the substrates of the three-dimensional multi-chip module, and
said via holes are located at arbitrary locations on each plane of the three-dimensional multi-chip module.

16. The three-dimensional multi-chip module of claim 1, comprising at least one via chip located between and in electrical contact with two adjacent substrates, the at least one via chip comprising electrically conducting paths from a surface thereof to an opposite surface thereof for electrically interconnecting electrically conducting layers at and/or in facing layers of the two adjacent substrates.

17. The three-dimensional multi-chip module of claim 1, further comprising positioning means on one of the integrated circuit and on one of the substrates which are pressed against each other, for achieving an accurate positioning of the integrated circuit chip on the substrate.

18. The three-dimensional multi-chip module of claim 17, wherein the positioning means comprise a groove located on a surface of one of the integrated circuit chips and one of the substrates for cooperating with a projection provided on a surface of the other integrated circuit chip and the other substrate.

19. The three-dimensional multi-chip module of claim 17, wherein the positioning means comprise electrically conducting surface areas, which electrically contact each other when the integrated circuit chip and the substrate are pressed against each other.

20. The three-dimensional multi-chip module of claim 17, wherein the positioning means comprise projections located on a surface of one of the substrates for cooperating with edge surfaces or corners of the integrated circuit chip which is pressed against the substrate.

21. A three-dimensional multi-chip module comprising a plurality of basically planar multi-chip modules and futher comprising at least two integrated circuits connected to each other, each basically planar multi-chip module comprising a substantially flat substrate and at least one integrated circuit chip mounted on a surface of the substrate, the three-dimensional multi-chip module comprising a free space provided at a marginal region at an edge of the substrate of one of the at least two basically planar multi-chip modules, the marginal region carrying no chips or other components but having exposed, electrically conducting areas;
the three-dimensional multi-chip module further comprising a detachable connector unit having a shape being adapted to be inserted at least partially in the free space at the marginal region and carrying an electrically conductive pattern on a surface of the connector unit, the conductive pattern being adapted to come in electrical contact with the exposed, electrically conducting areas on the marginal region when the connector unit is inserted in the free space.

22. The three-dimensional multi-chip module of claim 21, wherein the connector unit has the shape of an elongated rectangular body or strip having a central axis in a longitudinal direction thereof, a portion of the connector unit located at one side of the central axis being adapted to electrically contact the substrate of one of the at least two basically planar multi-chip modules when the connector unit is inserted in the free space.

23. The three-dimensional multi-chip module of claim 22, wherein a portion of the connector unit located at the other, opposite side of its central axis is adapted to electrically contact a substrate in another, similar three-dimensional multi-chip module.

24. The three-dimensional multi-chip module of claim 22, wherein a portion of the connector unit located at the other, opposite side of its central axis is adapted to electrically contact electrically conducting areas in a connector means or a backplane.

25. The three-dimensional multi-chip module of claim 21, further comprising positioning means provided on the connector unit and on the marginal region at the free space for achieving an accurate positioning of the connector unit on the substrate having the marginal region.

26. The three-dimensional multi-chip module of claim 25, wherein the positioning means comprise projections located on a surface at the marginal region of the substrate for cooperating with edge surfaces or corners of the connector unit.

27. A three-dimensional multi-chip module comprising a plurality of basically planar multi-chip modules and further comprising at least two integrated circuits electrically connected to each other, each basically planar multi-chip module comprising at least one chip and a substrate, the at least one chip being mounted on the substrate, positioning means being arranged on the at least one chip mounted on the substrate and on the substrate, the at least one chip mounted on the substrate and a second substrate corresponding to a second basically planar multi-chip modules being pressed against each other to provide the mounting of the at least one chip on the substrate, the positioning means acting in order to achieve an accurate positioning of the at least one chip on the substrate, wherein the positioning means comprise projections located on a surface of the substrate, on which the at least one chip in mounted, the projections cooperating with edge surfaces or corners of the at least one chip which is mounted on the substrate.

28. The three-dimensional multi-chip module of claim 27, wherein the projections have a substantially triangular cross-section.

29. The three-dimensional multi-chip module of claim 28, wherein the projections have a cross-section having the shape of an isosceles triangle.

* * * * *